United States Patent [19]

Ura et al.

[11] 4,164,436
[45] Aug. 14, 1979

[54] PROCESS FOR PREPARATION OF SEMICONDUCTOR DEVICES UTILIZING A TWO-STEP POLYCRYSTALLINE DEPOSITION TECHNIQUE TO FORM A DIFFUSION SOURCE

[75] Inventors: Mitsuru Ura; Kenji Miyata; Takaya Suzuki; Takuzo Ogawa, all of Ibaraki, Japan

[73] Assignee: Hitachi, Ltd., Tokyo, Japan

[21] Appl. No.: 925,792

[22] Filed: Jul. 18, 1978

[30] Foreign Application Priority Data

Jul. 22, 1977 [JP] Japan .................................. 52-87437

[51] Int. Cl.$^2$ .................. H01L 21/205; H01L 21/225
[52] U.S. Cl. ................... 148/174; 29/576 E; 29/577 R; 29/591; 148/188; 357/13; 357/59; 357/89; 427/85; 427/86
[58] Field of Search ................. 148/174, 188; 357/59, 357/89; 427/85, 86; 29/576 E, 591, 577

[56] References Cited

U.S. PATENT DOCUMENTS

| | | | |
|---|---|---|---|
| 3,460,007 | 8/1969 | Scott .................................. | 148/188 X |
| 3,519,901 | 7/1970 | Bean et al. ........................ | 148/174 X |
| 3,764,413 | 10/1973 | Kakizaki et al. ..................... | 148/188 |
| 3,783,050 | 1/1974 | Nanba et al. ........................... | 148/188 |
| 3,900,597 | 8/1975 | Chruma et al. ........................ | 427/82 |
| 3,912,557 | 10/1975 | Hochberg ........................ | 148/188 X |
| 3,928,095 | 12/1975 | Harigaya et al. ..................... | 148/188 |
| 4,004,954 | 1/1977 | Tshudy et al. ........................ | 148/174 |
| 4,063,973 | 12/1977 | Kirita et al. ............................ | 148/188 |

Primary Examiner—R. Dean
Assistant Examiner—W. G. Saba
Attorney, Agent, or Firm—Craig & Antonelli

[57] ABSTRACT

A semiconductor substrate having a single crystal semiconductor layer of one conductivity type exposed to the surface thereof is maintained at a temperature lower than the temperature at which the semiconductors is precipitated from the gas phase. In this state, a gas of a starting material of a semiconductor, a gas containing impurities capable of forming a semiconductor of the other conductivity type and a carrier gas therefore are fed onto the semiconductor substrate. Then, the semiconductor substrate is heated to form an amorphous or polycrystalline semiconductor layer of the other conductivity type on the semiconductor substrate. Simultaneously, the impurities of the other conductivity type are diffused from the amorphous or polycrystal semiconductor layer into the substrate which has a single crystal semiconductor layer of one conductivity type, to form a single crystal semiconductor layer having a p-n junction just below the amorphous or polycrystal semiconductor layer between the amorphous or polycrystalline semiconductor layer and the single crystal semiconductor layer of one conductivity type.

In a p-n junction to be formed according to this process, the distribution of the concentration of impurities can be controlled precisely, and the step-like distribution of the concentration of impurities can be attained very well.

8 Claims, 4 Drawing Figures

PROCESS FOR PREPARATION OF SEMICONDUCTOR DEVICES UTILIZING A TWO-STEP POLYCRYSTALLINE DEPOSITION TECHNIQUE TO FORM A DIFFUSION SOURCE

BACKGROUND OF THE INVENTION (1) Field of the Invention

The present invention relates to a process for the preparation of semiconductor devices. More particularly, the invention relates to a process for forming p-n junctions according to the diffusion method.

(2) Description of the Prior Art

Various methods have heretofore been proposed for diffusion of impurities. Among them, from the viewpoints of prevention of contamination of the surface of a semiconductor substrate and control of the concentration of impurities, solid-to-solid diffusion methods are excellent, and of the solid-to-solid diffusion methods, a method in which a polycrystalline or amorphous semiconductor film containing therein impurities to be diffused is formed on the substrate and this film is used as a diffusion source (hereinafter referred to as "doped polysemiconductor method") is especially preferred from the viewpoints of protection of the surface of the semiconductor substrate and prevention of breakdown of a shallow diffusion junction at the high temperature heat treatment for formation of electrodes, because the polycrystalline or amorphous semiconductor film can be left after completion of the diffusion and metal electrodes can be formed on this film.

An instance of application of the doped polysemiconductor method to the preparation of semiconductor devices is illustrated in the specification on U.S. Pat. No. 3,460,007 to J. H. Scott, Jr. In this specification, there is disclosed a process in which boron is selectively diffused from the gas phase into a single crystal semiconductor substrate of the n-type to form a p-type semiconductor region, the semiconductor substrate is heated at a predetermined temperature of 580° to 700° C. in a nitrogen gas atmosphere in a furnace, a conductivity type-converting member which is phosphorus in this case, and silane is introduced into the furnace and by thermal decomposition of the silane at said predetermined temperature, an n-type polycrystal silicon layer is deposited on the p-type semiconductor region. In this specification, there also is disclosed a process for formation on n-p-n type transistors in which the above semiconductor substrate is further heated to form in the p-type semiconductor region an n-type semiconductor region forming a p-n junction between this region and the p-type semiconductor region by diffusion of phosphorus from the n-type polycrystalline silicon layer, and electrodes are formed on the n-type semiconductor substrate, the exposed area of the p-type single crystal semiconductor region and the surface of the n-type polycrystal silicon layer, respectively. This process is characterized in that the semiconductor substrate is heated at a predetermined temperature sufficient to cause thermal decomposition of silane and then silane and a phosphorus compound are fed onto the semiconductor substrate. In this process, however, any particular attention is not paid at all to the reproducibility of the distribution of the concentration of impurities or the step like distribution of impurities of the p-n junction.

Japanese Patent Application Laid-Open Specification No. 13572/76 discloses a process for the preparation of polycrystalline semiconductor films having a uniform and relatively large crystal grain size. According to the disclosed process, a substrate (for example, an Mo plate) is heated in a furnace at a first deposition temperature (for example, 550° C.), the temperature is then elevated to a second deposition temperature (for example, 620° C.) higher than the first deposition temperature, and a reactant gas is introduced into the furnace while the temperature is elevated or after elevation of the temperature, to form a predetermined second polycrystal film on the substrate. Also in this process, there is adopted a technique in which after the substrate has been heated to a temperature higher than the deposition temperature, a reactant gas containing a substance to be deposited is fed onto the substrate. This laid-open specification does not describe at all that a semiconductor is used as the substrate or the polycrystalline film is used as the source of diffusing impurities into a semiconductor substrate.

From the results of experiments made by us, it was confirmed that when a doped polysemiconductor is grown from the gas phase onto a single crystal semiconductor substrate heated at a predetermined temperature according to the above-mentioned doped polysemiconductor method, at the initial growth stage a doped polysemiconductor is not formed but a doped monosemiconductor is formed. The thickness of this doped monosemiconductor layer is several thousand Å at largest, and this thickness is delicately influenced by such factors as the crystal azimuth, the surface cleanness and the polishing condition of the surface and can not be controlled by adjusting these factors. Since a doped monosemiconductor layer formed at the initial stage by diffusion into the semiconductor substrate acts as a part of the single crystal layer having the same conductor type as that of the doped monosemiconductor layer, there is brought about a defect that it is very difficult to control precisely the quantity of impurities in the diffusion layer and the diffusion depth.

Although the doped polysemiconductor method can be applied to the production of a semiconductor device in which the step junction is required, for example, a Zener diode. In this case, however, in addition to the above-mentioned defect, there is caused another fatal defect by formation of the doped monosemiconductor. More specifically, since the speed of direct diffusion of impurities into the single crystal substrate from the polysemiconductor is lower than the speed of diffusion of impurities into the single crystal substrated from or through the monosemiconductor, in a Zener diode in which high step characteristics of the p-n junction are required, a necessary impurity concentration gradient cannot be obtained. Therefore, the resulting Zener fails to have required step characteristics.

BRIEF SUMMARY OF THE INVENTION

It is a primary object of the present invention to provide a doped polysemiconductor method in which the thickness of the diffusion layer and the quantity of impurities can be precisely controlled.

Another object of the present invention is to provide a doped polysemiconductor method in which a junction having good step characterstics can be obtained.

The present invention relates to a process for forming a diffusion junction in a single crystal semiconductor substrate having a layer of one conductor type on at least one main surface portion there of according to the doped polysemiconductor method, this process being characterized in that a gas of a starting substance of a semiconductor, a dopant gas and a carrier gas therefor are fed onto the single crystal layer of the semiconductor substrate maintained at a temperature lower than the temperature at which a semiconductor is substantially deposited from the gas phase, then the temperature is elevated to a temperature high enough to cause substantial deposition of the semiconductor, to form a predetermined polycrystalline semiconductor layer, and impurities determining the conductor type of the polycrystalline semiconductor layer are diffused into the layer of one conductor type of the semiconductor substrate simultaneously with formation of the polycrystalline semiconductor layer or by the subsequent heat treatment. According to the present invention, since a polycrystalline semiconductor is formed even at the initial growth stage, the foregoing defects can be eliminated.

The critical temperature at which a semiconductor is substantially deposited from a gas of a starting substance of a semiconductor, a dopant gas and a carrier gas therefor is changed depending on the kind of the starting substance gas and the mole ratio of the starting substance gas to the carrier gas, and it is difficult to determine this critical temperature simply. However, if the kind of the starting substance gas and other conditions are fixed, the critical temperature may be decided by experiments or according to an empirical formula derived from the results of experiments. These conditions determining the critical temperature are appropriately set in practising the present invention.

However, since the time for which the semiconductor substrate is maintained at this critical temperature during the process steps of preparing a semiconductor device is very short, if the temperature is lower than about 500° C., no substantial growth of the semiconductor is inhibited irrespective of the kind of the starting substance gas.

From the viewpoint of simplification of the process steps, it is preferred that diffusion be conducted simultaneously with deposition of a polycrystalline semiconductor on the semiconductor substrate. Accordingly, it is preferred that the temperature for deposition of a polycrystalline semiconductor layer be a temperature enough to diffuse impurities by using this layer as the diffusion source. Also this temperature is appropriately decided in practising the present invention. If this temperature is too low, the growth speed is low, and if this temperature is too high, a single crystal semiconductor is allowed to grow. It is preferred that this temperature be lower than 950° C.

DETAILED DESCRIPTION OF THE PREFERRED EMBODIMENTS

The present invention will now be described in detail by reference to the following Examples that by no means limit the scope of the invention.

EXAMPLE 1

In this Example, an embodiment in which the process of the present invention is applied to the preparation of a Zener diode having a relatively low yield voltage.

Figure 1:
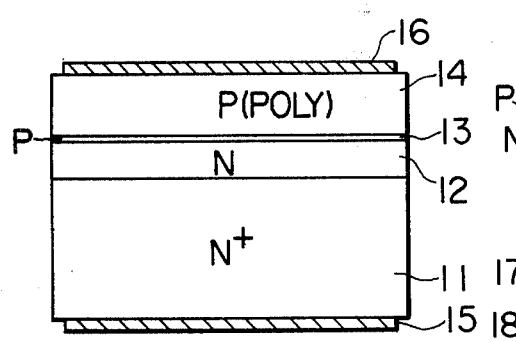
FIG. 1 is a diagram illustrating the sectional structure of a Zener diode prepared according to the process of the present invention.

Referring to FIG. 1 illustrating the diode of this Example, a single crystal silicon layer 12 of the n-type is formed continuously to a single crystal silicon substrate 11 of the n+-type having a low resistivity. A p-type single crystal diffusion layer 13 forming a p-n junction with the n-type single crystal layer 12 is formed on the n-type single crystal layer 12, and a p-type polycrystalline silicon layer 14 acting as the diffusion source to the p-type diffusion layer 13 is formed on this diffusion layer 13. A pair of electrodes 15 and 16 are formed on the n+-type single crystal layer and the exposed main surface of the p-type polycrystalline layer 14.

This Zener diode is prepared according to the following process procedures.

A single crystal silicon wafer of the n-type having a resistivity lower than 0.01Ω-cm and a thickness of 0.25 mm is chosen as the substrate 11, and a single crystal silicon layer 12 of the n-type having a thickness of 5 μm and a resistivity of 0.02Ω-cm is formed on one main surface of the substrate 11 by the epitaxial growth method. This wafer is located in a gas phase growth reaction furnace. The surface portion of the n-type epitaxial layer 12 is uniformly removed along a depth of about 0.2 μm according to the gas phase etching method, to form a clean surface. After the gas phase etching, the wafer is maintained at a temperature of 400° C., which is lower than the critical temperature necessary for deposition of an amorphous or polycrystalline silicon layer 14 of the p-type from the gas phase. Subsequently, hydrogen is introduced into the reaction furnace at a feed rate of 30 l/min and simultaneously, trichlorosilane, $SiHCl_3$, as as the starting substance of silicon and diborane, $B_2H_6$, as the doping gas, are incorporated into hydrogen in amounts of 1.0 mole % and $2\times10^{-4}$ mole %, respectively. Heating of the wafer is initiated while maintaining the above feed rates of the gases and the temperature of the silicon wafer is elevated to 900° C. and this temperature is maintained. The reaction is conducted until a polycrystalline silicon layer 14 of the p-type is deposited on the surface of the n-type single crystal layer 12 along a thickness of about 10 μm. Then, incorporation of trichlorosilane, $SiHCl_3$, and diborane, $B_2H_6$, is stopped and simultaneously, heating of the reaction furnace is stopped. Thus, the wafer is cooled while flowing hydrogen alone. When the temperature in the reaction furnace is lowered below about 100° C., the wafer is taken out, and a pair of electrodes 15 and 16 composed of, for example, aluminum, are formed on both the surfaces of the wafer, respectively. The wafer is subjected to a pelletizing treatment to attain a predetermined dimension and then subjected to the surface-stabilizing treatment and assembling processing to obtain a Zener diode.

According to this embodiment, since a polycrystalline silicon layer 14 can be directly formed on the surface of the wafer, the thickness of a diffusion layer 13 formed by using this polycrystalline layer as the diffusion source and the distribution of the concentration of impurities can be directly controlled by the temperature and time of the above-mentioned polycrystalline layer-growing step. Accordingly, a Zener diode having a much reduced deviation of the yield characteristics can be prepared.

In a Zener diode, a p-n junction having good step characteristics is necessary for attaining good Zener yield. In the present embodiment, since a polycrystalline silicon layer deposited directly on a single crystal wafer and having a conductivity type opposite to that of the wafer is used as the diffusion source, the speed of diffusion of impurities of the opposite conductivity type into the wafer is much higher than in the conventional process in which a single crystal silicon layer formed substantially at the initial growth stage of a polycrystalline layer and having a conductivity type opposite to that of the wafer is used as the diffusion source. Accordingly, in the present embodiment, it is possible to obtain a Zener diode having a sufficiently large gradient of the concentration of impurities.

EXAMPLE 2

In this Example, an embodiment in which the process of the present invention is applied to the preparation of a Zener diode of the temperature compensation type.

Figure 2:
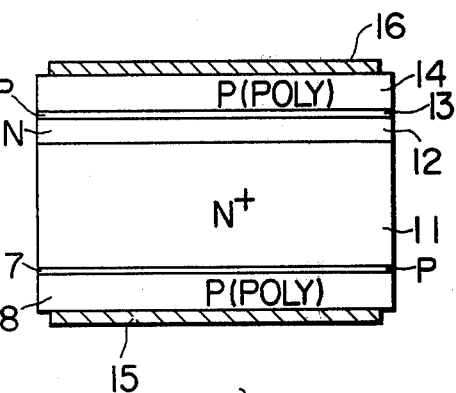
FIG. 2 is a diagram illustrating the sectional structure of a Zener diode of the temperature compensation type prepared according to the process of the present invention.

Referring to FIG. 2 illustrating the diode of this Example, a single crystal silicon layer 12 is formed continuously to one main surface of a single crystal silicon substrate 11 of the n+-type having a low resistivity.

A first p-type single crystal diffusion layer 13 forming a first p-n junction with the n-type single crystal layer 12 is formed on this layer 12, and a first p-type polycrystalline silicon layer 14 acting as the diffusion source for the diffusion layer 13 is formed on the p-type diffusion layer 13. A second p-type single crystal diffusion layer 17 forming a second p-n junction with the substrate 11 is formed on the other main surface of the substrate 11 of the n+-type and a second p-type polycrystalline silicon layer 18 acting as the diffusion source for the p-type diffusion layer 17 is formed on the p-type diffusion layer 17. A pair of electrodes 16 and 15 are formed on the exposed main surfaces of the first and second p-type polycrystalline silicon layers 14 and 18, respectively. When the two p-n junctions are thus connected in seriesiin reverse directions, the temperature coefficients of yield voltages of both the junctions are compensated by each other, and the temperature coefficient of the yield voltage of the diode as a whole can be reduced. In this case, since the temperature coefficient of the yield voltage of the p-n junction to be reversely biassed is greatly changed by the yield voltage at room temperature, in order to obtain such diode having a low temperature coefficient, it is necessary to reduce the deviation of the yield voltage at room temperature of the p-n junction to be reversely biassed.

The diode of this Example is prepared according to the following process procedures.

An n-type single crystal silicon wafer having a resistivity lower than $0.01 \Omega$-cm and a thickness of 0.25 mm is used as the substrate 11. An n-type single crystal silicon layer 12 having a thickness of 5 $\mu$m and a resistivity of $0.02\Omega$-cm is formed on one main surface of the substrate 11 by the epitaxial growth method, and the wafer is disposed in a gas phase growth reaction furnace. According to the known gas phase etching method, the surface porion of the n-type single crystal silicon layer 12 is uniformly removed along a depth of about 0.2 $\mu$m to expose a clean semiconductor surface.

After the gas phase etching operation, the wafer is maintained at a temperature of 400° C., which is lower than the reaction temperature for deposition of the first p-type polycrystalline silicon layer 14 from the gas phase. Subsequently, hydrogen is introduced into the reaction furnace at a flow rate of 30 l/min, and trichlorosilane, $SiHCl_3$, as the starting substance of silicon and diborane, $B_2H_6$, as the doping gas are incorporated in hydrogen in amounts of 1.0 mole % and $2 \times 10^{-4}$ mole %, respectively. While maintaining the above gas flow rates, heating of the wafer is initiated to elevate the temperature of the silicon wafer to 900° C., and this temperature is maintained and the reaction is continued until a first p-type polycrystalline silicon layer 14 having a thickness of about 10 $\mu$m is deposited on the surface of the n-type single crystal layer 12.

Then, incoroporation of trichlorosilane, $SiHCl_3$, and diborane, $B_2H_6$, into hydrogen is stopped, and simultaneously, heating of the wafer is stopped. Thus, the wafer is naturally cooled while flowing hydrogen alone. When the temperature in the furnace is lowered below about 100° C., the wafer is turned over so that the n+-type substrate 11 is located on the top side and in this state, the wafer is put in the reaction furnace again. Then, a second p-type polycrystalline silicon layer 18 is deposited on the n+-type single crystal substrate 11 according to the same method as described above with respect to formation of the first polycrystalline silicon layer 14. Namely, after the gas phase etching, the wafer is maintained at a temperature lower than the reaction temperature for depositing the second p-type polycrystalline silicon layer 18 from the gas phase, and subsequently, the same reaction gas and carrier gas as those used for formation of the first p-type polycrystalline silicon layer are introduced into the furnace at the same flow rates as described above. Then, the heating of the wafer is initiated to elevate the wafer temperature to 900° C. and this temperature is maintained. The reaction is continued until the thickness of the second p-type polycrystal silicon layer 18 is increased to 10 $\mu$m. The time required for this reaction is about 30 minutes.

After completion of the reaction, supply of the reaction gases other than the hydrogen gas is stopped, and simultaneously, the heating is stopped and the wafer is cooled. When the temperature in the reaction furnace is lowered below 100° C., the wafer is taken out and a pair of metal electrodes 15 and 16 are formed on both the surfaces of the wafer, respectively. Then, the wafer is pelletized to a predetermined dimension, and then subjected to the surface stabilizing treatment and the assembling processing to obtain a Zener diode.

When a voltage is applied to the so prepared Zener diode so that the electrode 16 is on the negative side and the electrode 15 is on the positive side, characteristics of a Zener voltage temperature coefficient of less than 0.005%/°C. can be obtained with a high production yield. The reason for attainment of such effects is that a polycrystal silicon layer having a conductivity type opposite to that of the wafer is directly formed on the surface of the wafer as in Example 1 and a diffusion layer and a p-n junction are formed by using this polycrystal silicon layer as the diffusion source.

EXAMPLE 3

This Example illustrates an embodiment in which the process of the present invention is applied to the preparation of a diode which is characterized by an especially low forward voltage drop and an especially short recovery time in either the forward or reverse direction.

We previously proposed a semiconductor rectifier having a low forward voltage drop and a short recovery time, which is characterized by having a very thin diffusion layer in which the quantity of impurities determining the conductor type of the diffusion layer per unit area of the diffusion layer (corresponding to the value obtained by multiplying the impurity concentration, p atoms/cm$^3$, in the diffusion layer by the thickness, t cm, of the diffusion layer) is $1\times 10^{11}$ to $1\times 10^{14}$ atoms/cm$^2$ (see Matsuzaki et al., U.S. Ser. No. 709,246 for SEMICONDUCTOR RECTIFIER HAVING SMALL FORWARD VOLTAGE DROP, filed on July 27, 1976).

The process of the present invention is very effective for the case where the impurity concentration and thickness of the diffusion layer should be controlled within very narrow regions as in the above-mentioned semiconductor rectifier.

Figure 3:
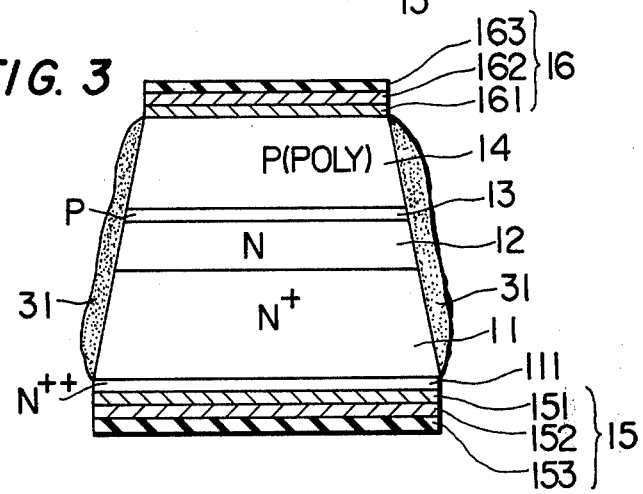
FIG. 3 is a diagram illustrating the sectional structure of a diode having a small forward voltage drop, which is prepared according to the process of the present invention.

Referring to FIG. 3 illustrating the diode of this Example, an n-type single crystal silicon layer 12 is formed on one main surface of a single crystal silicon substrate 11 of the n+-type. A p-type single crystal silicon layer 13 forming a p-n junction with the n-type single crystal silicon layer 12 is formed on this layer 12, and a p-type polycrystal silicon layer 14 as the source of diffusion of p-type impurities to the single crystal layer 13 is formed on this single crystal layer 13. A single crystal silicon layer 111 of the n++-type having a higher impurity concentration than the substrate 11 is formed on the other main surface of the n+-type polycrystal silicon substrate 11. A pair of electrodes 15 and 16 composed of a laminated film of Cr, Ni and Ag arranged in this order seen from the semiconductor side are formed on the main exposed surfaces of the n++-type single crystal layer 111 and the p-type polycrystal layer 14.

The diode of this Example is prepared according to the following process procedures.

A single crystal silicon wafer of the n-type having a resistivity lower than 0.01Ω-cm and a thickness of 0.25 mm is used as the substrate 11, and a single crystal silicon layer 12 of the n-type having a thickness of 6 μm and a resistivity of 5Ω-cm is formed on one main surface of the substrate according to the epitaxial growth method. Then, the wafer is placed in a reaction furnace and the surface portion of the n-type single crystal silicon layer 12 is uniformly etched along a depth of about 0.3 μm according to the known gas phase etching method, for example, by heating in a gaseous mixture of hydrogen and hydrogen chloride to remove oxides and contaminants on the surface and expose a clean silicon atom surface. Then, the temperature of the wafer is lowered to room temperature. At room temperature, 30 l/min of hydrogen, 1.0 mole %/min of silane trichloride, SiHCl$_3$, as the starting substance of silicon and $1.4\times 10^{-5}$ mole %/min of diborane, B$_2$H$_6$, as the doping gas are introduced into the reaction furnace.

While maintaining the above gas flow rates, reheating of the wafer is initiated and the temperature of the silicon wafer is elevated to, for example, 900° C. This elevated temperature is maintained and the gas phase growth reaction is continued until a p-type polycrystal silicon layer 14 having a thickness of about 25 μm is deposited on the surface of the n-type single crystal layer 12. The time required for deposition is about 60 minutes. After completion of deposition, supply of SiHCl$_3$ and B$_2$H$_6$ is stopped and simultaneously, heating of the furnace is stopped. The wafer is cooled while flowing hydrogen alone. In the above-mentioned gas phase reaction, boron has been diffused into the n-type single crystal silicon layer 12 from the p-type polycrystal silicon layer 14, whereby a p-type single crystal silicon layer 13 having an impurity concentration of about $1\times 10^{17}$ atoms/cm$^3$ and a thickness of about 0.05 μm has been formed.

Then, phosphorus is diffused at 900° C. from the other main surface of the n+-type substrate to form a single crystal silicon layer 111 of the n++-type having an impurity concentration of about $1\times 10^{20}$ atoms/cm$^3$ and a thickness of about 1 μm. This n++-type single crystal layer 111 produces a good ohmic contact between the substrate 11 and the electrode 15 and attains an effect of reducing the forward voltage drop in this portion. A pair of laminated electrodes 15 and 16 including a Cr layer 151 or 161, an Ni layer 152 or 162 and an Ag layer 153 or 163 are formed by the vacuum deposition method on the exposed main surfaces of the p-type polycrystal silicon layer 14 and n++-type single crystal layer 111, respectively.

According to the sand cut method, the wafer is formed into pellets having a bevel, and the end face the pellet including the exposed end of the p-n junction is coated with a silicone rubber 31.

The forward voltage drop of this diode is 0.77 V and 0.59 V at the junction temperature of 25° C. and 150° C., respectively, when the current density in the forward direction is 100 A/cm$^2$. The reverse blocking voltage is 130 V at room temperature, and the reverse recovery time and forward recovery time are 55 nsec and 45 nsec, respectively.

In the present embodiment, when the thickness of the n-type single crystal layer 12 is smaller than 30 μm and the quantity of impurities per unit area of the p-type single crystal diffusion layer 13 (approximately the product of the thickness of the diffusion layer 13 and the impurity concentration in the diffusion layer 13) is $1\times 10^{11}$ to $1\times 10^{14}$ atoms/cm$^2$, there is obtained a diode in which the forward voltage drop is sufficiently low and the recovery time in either the forward or reverse direction is sufficiently short.

In the present embodiment, the temperature of the semiconductor substrate at which introduction of the starting substance gas, dopant gas and carrier gas therefor to the semiconductor substrate is initiated is adjusted to room temperature. By this arrangement, the following effect can be attained.

Minute amounts of impurities such as O$_2$ and H$_2$O are generally contained in the carrier gas. When the semiconductor substrate is preliminarily maintained at a temperature higher than room temperature, though this temperature does not cause precipitation of a semiconductor from the gas phase, the impurities in the carrier gas, especially H$_2$O, adsorb to the substrate surface and there is a fear that the condition of the surface of the semiconductor substrate will be degraded. However, when the carrier gas is introduced onto the semiconductor substrate maintained at room temperature as in the present embodiment, non-desiable impurities such as H$_2$O readily react with the simultaneously introduced starting substance gas or dopant gas, rather than adsorb to the semiconductor substrate. Accordingly, the fear of degradation of the surface condition of the semiconductor substrate can be completely eliminated.

EXAMPLE 4

This Example illustrates an embodiment in which the process of the present invention is applied to the preparation of a thyristor.

Figure 4:
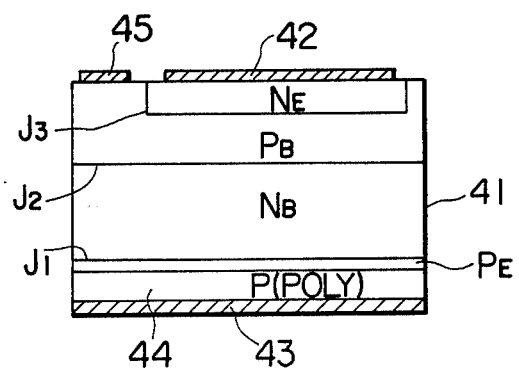
FIG. 4 is a diagram illustrating the sectional structure of a thyristor prepared according to the process of the present invention.

Referring to FIG. 4 showing the sectional structure of the thyristor of this Example, reference numeral 41 represents a 4-layer semiconductor substrate comprising an N emitter layer $N_e$, a P base layer $P_b$, an N base layer $N_b$ and a P emitter layer $P_e$. Reference numeral 42 represents a cathode electrode having ohmic contact with the N emitter layer, reference numeral 43 represents an anode electrode having ohmic contact with a polycrystal semiconductor layer 44, and reference numeral 45 represents a gate electrode having ohmic contact with the P base layer. This thyristor is prepared according to the following process procedures.

An N-type single crystal silicon substrate prepared according to the floating zone method and having a resistivity of about 40Ω-cm and a thickness of 240 μm is used as the starting substrate. This silicon substrate is sealed with gallium in a quartz tube and heat-treated at 1150° C. for about 2 hours to form a thin P layer having a high concentration on the silicon surface. The silicon plate is taken out from the quartz tube and the thin P layer is removed from one surface according to the known method, for example, by etching, and then, the drive-in diffusion is carried out at 1250° C. for about 20 hours by using the remaining P base layer as the impurity source to form a P base layer. A silicon oxide film formed during the drive-in diffusion step is partially removed according to the photoetching technique and phosphorus is deposited on the silicon oxide-removed area at 1100° C. for about 30 minutes by using $POCl_2$ as the source. Phosphorus glass formed during this deposition step is removed by hydrofluoric acid, and drive-in diffusion is carried out at 1200° C. for about 7 hours to form an N emitter layer $N_e$ having a concentration of $6.8 \times 10^{16}$ atoms/cm$^2$. Then, the silicon plate is sealed again with gallium in a quartz tube and the surface concentration of the P base layer $P_b$ is thus increased. The thin P layer formed by this step on the surface opposite to the surface where the N emitter layer $N_e$ is present is removed by etching. Thus, an NPN structure is formed, in which the thickness of the N emitter layer is 15 m, the thickness of the P base layer is 30 m and the thickness of the N base layer is 170 m.

Finally, a boron-containing polycrystalline silicon layer 44 is grown directly from the gas phase on the surface opposite to the surface where the N emitter layer is present. $SiHC_3$ and $B_2H_6$ are used as the silicon source and boron source, respectively, and hydrogen is used as the carrier gas. These gases are supplied on the semiconductor substrate maintained at room temperature, and the temperature is elevated to a growth temperature of 950° C. and a polycrystal having a thickness of 26 m is grown over a period of 25 minutes at this temperature. During this step, boron is diffused in the single crystal and a P emitter layer $P_e$ is formed.

The quantity of impurities per unit area of the P emitter layer is $2.6 \times 10^{12}$ atoms/cm$^2$.

Then, a cathode electrode 42, an anode electrode 43 and a gate electrode 45 are formed. Thus, production of a thyristor is completed except a passivation process of the edge of p-n junctions which is omitted in the description of this example.

Electric characteristics of the so prepared thyristor are a forward blockage voltage of 1050 V, a reverse blockage voltage of 1100 V and a forward voltage drop of 0.92 V at 100 A/cm$^2$ in the conducting state.

In each of the foregoing embodiments, a p-type diffusion layer is formed on an n-type region. Needless to say, the present invention can be applied to the manufactor of a semiconductor device in which the conductor types are reversed. Further, the kinds of the starting semiconductor gas, dopant gas and carrier gas that can be applied in the present invention are not limited to those used in the foregoing embodiments. For example, $SiH_4$, $SiH_2Cl_2$ and $SiCl_4$ may be used as the starting semiconductor gas. However, the use of $SiHCl_3$ as the starting gas is preferred because a polycrystal silicon film can be obtained stably, uniformely and reproducibly in this case.

In the present invention, the temperature is elevated from a low level not causing precipitation of a semiconductor on a semiconductor substrate from the gas phase to a high level causing deposition of a polycrystal semiconductor. It is preferred that this temperature elevation be conducted at a rate of 10° to 100° C./min. If the temperature-elevating rate is below this range, it is difficult to control a necessary diffusion quantity, and no better results are obtained.

The production method of the diodes and reverse blocking thyristor is illustrated in the foregoing embodiments. As will be apparent to those skilled in the art, the process of the present invention can be applied to the production of diodes and thyristors having a structure other than the structure mentioned above and other semiconductor elements such as transistors.

As will be apparent from the foregoing illustration, according to the process of the present invention, it is possible to precisely control the thickness of the diffusion layer and the quantity of impurities in the p-n junction formed according to the doped polysemiconductor method, and step-like distribution of the impurity concentration can be remarkably improved.

What we claim is:

1. A process for the preparation of semiconductor devices, which comprises the steps of:
   (a) maintaining a semiconductor substrate having a semiconductor single crystal region of one conductivity type exposed on one main surface thereof, at a temperature lower than the temperature causing substantial precipitation of a semiconductor from the gas phase,
   (b) initiating supply of a gaseous mixture comprising a gas of a starting substance of a semiconductor, a gas of impurities capable of providing a semiconductor of the other conductivity type and a carrier gas therefor to said main surface of the semiconductor substrate,
   (c) heating said semiconductor substrate to grow from the gas phase an amorphous or polycrystalline semiconductor layer of the other conductor type on said one main surface of the semiconductor substrate and diffuse the impurities deciding the conductor type of the amorphous or polycrystalline semiconductor layer of the other conductivity type, into said semiconductor single crystal region of one conductivity type, whereby a semiconductor single crystal region of the other conductivity type is formed in said semiconductor single crystal region of one conductivity type, and
   (d) forming electrodes at predetermined positions including said amorphous or polycrystalline semiconductor layer.

2. A process for the preparation of semiconductor devices according to claim 1 wherein at the step (a), the semiconductor substrate is maintained at a temperature ranging from room temperature to 500° C.

3. A process for the preparation of semiconductor devices according to claim 2 wherein at the step (a), the semiconductor substrate is maintained at room temperature.

4. A process for the preparation of semiconductor devices according to claim 1 wherein at the step (c), the growth of the amorphous or polycrystal semiconductor layer of the other conductivity type is conducted simultaneously with the formation of the semiconductor single crystal region of the other conductivity type in the semiconductor single crystal region of one conductivity type.

5. A process for the preparation of semiconductor devices according to claim 1 wherein the semiconductor substrate used at the step (a) has a pair of main surfaces and includes a first single crystal region of one conductivity type exposed to one main surface and a second single crystal region of the other conductivity type exposed to the other main surface and having an impurity concentration higher than that of the first single crystal region, and wherein at the step (d), a pair of electrodes are formed on the exposed surface of the amorphous or polycrystal semiconductor layer and the other main surface of the semiconductor substrate, respectively.

6. A process for the preparation of semiconductor devices according to claim 1 wherein the semiconductor substrate is composed of Si and the gas of the starting substance of the semiconductor is a gas of a compound containing Si.

7. A process for the preparation of semiconductor devices according to claim 6 wherein at the step (a), the semiconductor substrate is maintained at room temperature, at the step (b), a gas of $SiHCl_3$ and a gas of $H_2$ are used as the gas of the starting substance of the semiconductor and the carrier gas, respectively, and wherein at the step (c), the semiconductor substrate is heated at 900° to 950° C. to effect simultaneously the growth of a polycrystal Si layer of the other conductivity type and the formation of a single crystal Si region of the other conductivity type in the single crystal Si region of one conductivity type so that the quantity of the conductivity type-deciding impurities present in the single crystal Si region of the other conductivity type per unit area is $1 \times 10^{11}$ to $1 \times 10^{14}$ atoms/cm$^2$.

8. A process for the preparation of semiconductor devices according to claim 1 wherein the semiconductor substrate used at the step (a) has a pair of main surfaces and includes a first single crystal region of one conductivity type exposed to one main surface, a second single crystal region of the other conductivity type contiguous to the first single crystal region and forming a p-n junction therewith and a third single crystal region of one conductor type contiguous to the second single crystal layer, exposed to the other main surface and forming a p-n junction with the second single crystal region, and wherein at the step (d), a pair of main electrodes are formed on the exposed main surface of the amorphous or polycrystal semiconductor layer and the exposed main surface of the first single crystal region on the other main surface, respectively.

* * * * *